(12) United States Patent
Yamada et al.

(10) Patent No.: US 11,289,351 B2
(45) Date of Patent: Mar. 29, 2022

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Tomoyuki Yamada, Toyama (JP); Tadashi Kontani, Toyama (JP); Shigenori Tezuka, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 68 days.

(21) Appl. No.: 16/797,783

(22) Filed: Feb. 21, 2020

(65) Prior Publication Data
US 2020/0194291 A1    Jun. 18, 2020

Related U.S. Application Data

(63) Continuation of application No. PCT/JP2017/033414, filed on Sep. 15, 2017.

(51) Int. Cl.
| | | |
|---|---|---|
| *H01L 21/67* | (2006.01) | |
| *C23C 16/52* | (2006.01) | |
| *H01L 21/687* | (2006.01) | |

(52) U.S. Cl.
CPC ........ *H01L 21/67253* (2013.01); *C23C 16/52* (2013.01); *H01L 21/68707* (2013.01); *H01L 21/68742* (2013.01)

(58) Field of Classification Search
CPC ............. H01L 21/205; H01L 21/67103; H01L 21/67248; H01L 21/67253;
(Continued)

(56) References Cited

U.S. PATENT DOCUMENTS 5,529,657 A * 6/1996 Ishii ................... H01J 37/32642
156/345.26
6,110,322 A * 8/2000 Teoh ................... C23C 16/4586
118/723 E
(Continued)

FOREIGN PATENT DOCUMENTS

| JP | 2000-208421 A | 7/2000 |
|---|---|---|
| JP | 2000-324717 A | 11/2000 |

(Continued)

OTHER PUBLICATIONS

Japanese Office Action dated Feb. 9, 2021 for Japanese Patent Application No. 2019-541589.
(Continued)

*Primary Examiner* — Mohammed Shamsuzzaman
(74) *Attorney, Agent, or Firm* — Volpe Koenig

(57) ABSTRACT

There is provided a technique that includes a process chamber configured to process a substrate; a processing gas supply part configured to supply a processing gas to the substrate; a heater configured to heat the substrate; a transfer robot configured to transfer the substrate; a first power supply connected to at least one part selected from the group of the processing gas supply part, the heater, and the transfer robot; a first controller installed between the at least one part and the first power supply; a second power supply including two or more power sources configured to drive the first controller; and a second controller installed between the first controller and the second power supply and configured to allow power to be supplied to the first controller while setting a power ratio of each of the two or more power sources of the second power supply to a predetermined value.

7 Claims, 10 Drawing Sheets

(58) Field of Classification Search
CPC ......... H01L 21/67769; H01L 21/68707; H01L 21/68742
See application file for complete search history.

(56) References Cited

U.S. PATENT DOCUMENTS

| | | | |
|---|---|---|---|
| 2001/0054387 A1* | 12/2001 | Frankel | G07F 17/3202 |
| | | | 118/725 |
| 2014/0001154 A1* | 1/2014 | Sato | H01L 21/6833 |
| | | | 216/67 |
| 2017/0002461 A1* | 1/2017 | Johanson | H01J 37/3488 |
| 2017/0111025 A1* | 4/2017 | Kapoor | H02M 1/44 |
| 2017/0140963 A1 | 5/2017 | Kawsaki et al. | |
| 2018/0047576 A1* | 2/2018 | Takahashi | H01L 21/31111 |
| 2018/0076028 A1* | 3/2018 | Swaminathan | H01L 21/02164 |
| 2018/0211893 A1* | 7/2018 | Ichino | H01L 21/67126 |
| 2019/0057846 A1* | 2/2019 | Kusumoto | H01J 37/32522 |
| 2019/0096638 A1* | 3/2019 | Lavitsky | H01J 37/32513 |
| 2021/0183645 A1* | 6/2021 | Igawa | C23C 8/02 |

FOREIGN PATENT DOCUMENTS

| | | |
|---|---|---|
| JP | 2001-237186 A | 8/2001 |
| JP | 2010-102693 A | 5/2010 |
| JP | 2016-170491 A | 9/2016 |
| JP | 2016-178216 A | 10/2016 |
| WO | 2016-017685 A1 | 2/2016 |

OTHER PUBLICATIONS

International Search Report and English Translation, PCT/JP2017/033414 dated Oct. 31, 2017, 5 pgs.
Korean Office Action dated Jun. 15, 2021 for Korean Patent Application No. 10-2020-7004972.

* cited by examiner

| Whether or not a continuation of the process is required |
|---|
| Check the state of the power source and determine whether or not to continue the process<br><br>· Press "OK" when continuing the process<br>· Press "NO" when stopping the process |

Stop of function of power source A occurred

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation Application of PCT International Application No. PCT/JP2017/033414, filed on Sep. 15, 2017, the disclosure of which is incorporated herein in its entirety by reference.

TECHNICAL FIELD

The present disclosure relates to a substrate processing apparatus, a method of manufacturing a semiconductor device, and a recording medium.

BACKGROUND

In the related art, a substrate processing apparatus used in a semiconductor-device-manufacturing process is usually configured such that a transfer robot part for transferring a substrate transfers a substrate into a process chamber, a processing gas supply part supplies a processing gas, and a heater heats the substrate to a predetermined temperature, thereby performing a predetermined process such as a film-forming process or the like to the substrate in the process chamber.

SUMMARY

Some embodiments of the present disclosure provide a technique capable of extending the lifespan of a power source required for operation control of a substrate processing apparatus.

According to one or more embodiments of the present disclosure, there is provided a technique that includes a process chamber configured to process a substrate; a processing gas supply part configured to supply a processing gas to the substrate; a heater configured to heat the substrate; a transfer robot configured to transfer the substrate; a first power supply connected to at least one part selected from the group of the processing gas supply part, the heater, and the transfer robot; a first controller installed between the at least one part and the first power supply; a second power supply including two or more power sources configured to drive the first controller; and a second controller installed between the first controller and the second power supply and configured to allow power to be supplied to the first controller while setting a power ratio of each of the two or more power sources of the second power supply to a predetermined value.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or More Embodiments of the Present Disclosure

Hereinafter, embodiments of the present disclosure will be described with reference to the drawings.

Figure 1:
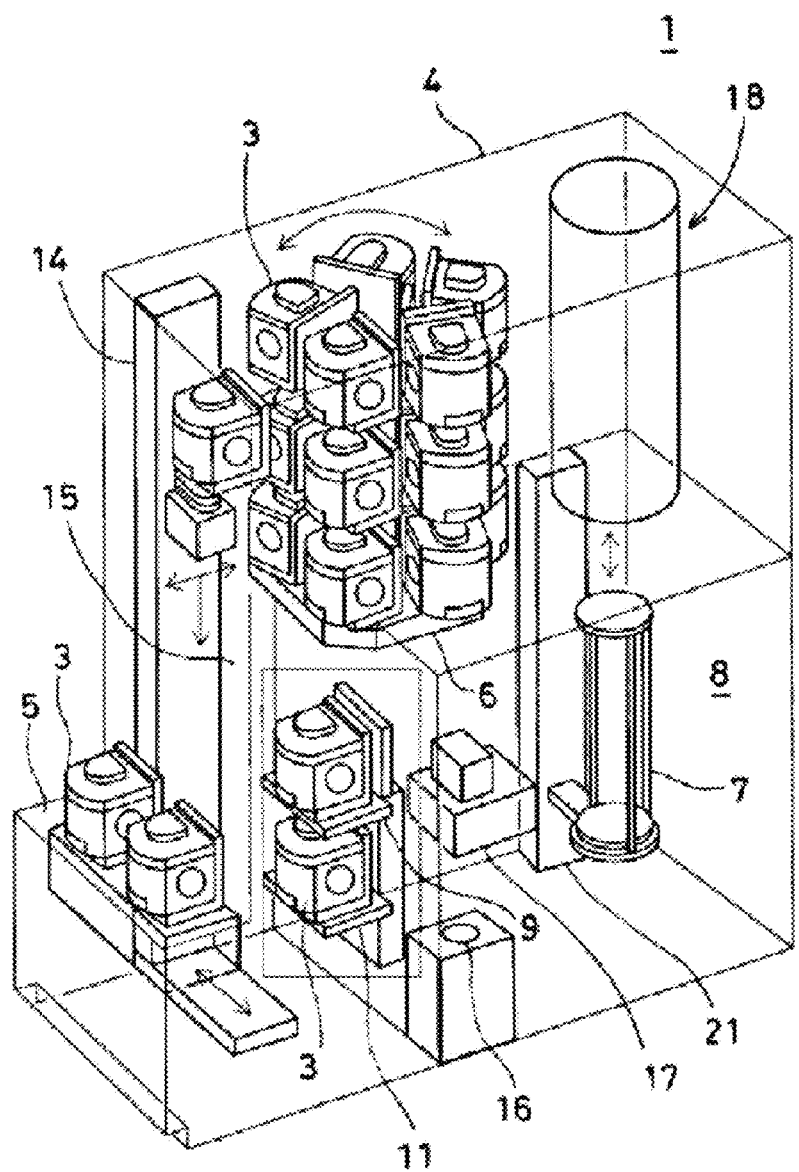
FIG. 1 is a perspective view schematically showing an example of a schematic configuration of a substrate processing apparatus according to embodiments of the present disclosure.
Figure 2:
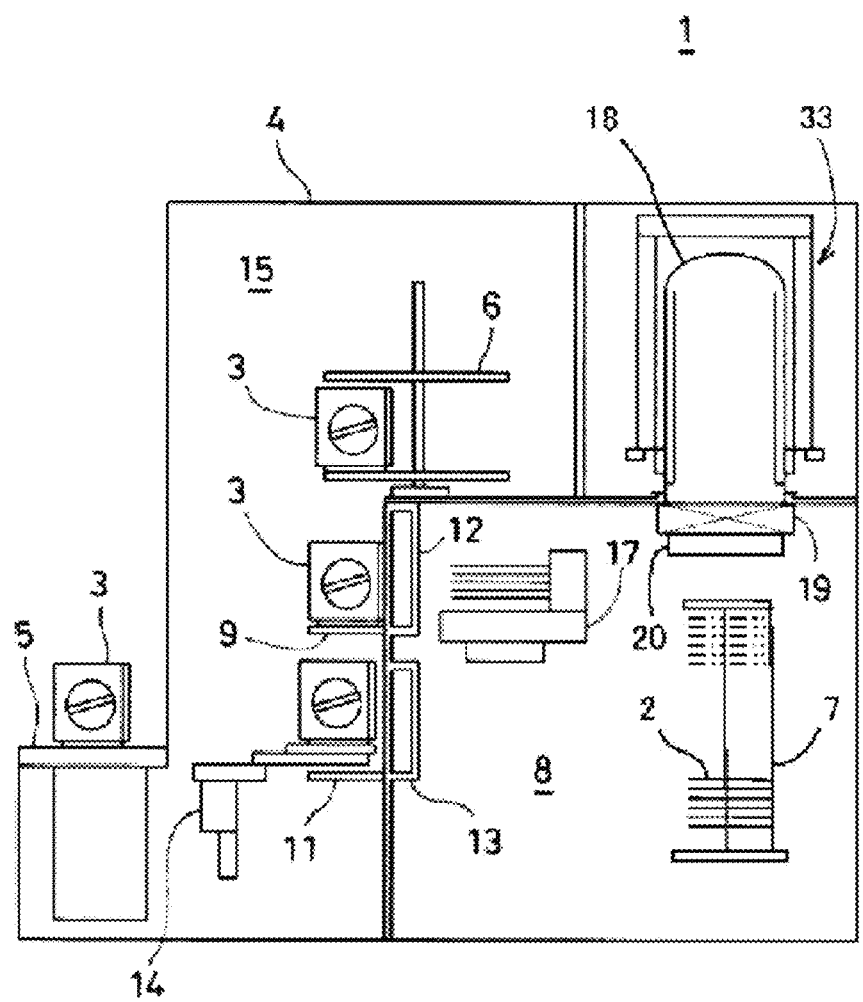
FIG. 2 is a sectional view schematically showing an example of the schematic configuration of the substrate processing apparatus according to embodiments of the present disclosure.

(1) One Example of Schematic Configuration of Substrate Processing Apparatus First, an example of a schematic configuration of a substrate processing apparatus according to the present disclosure will be described with reference to FIGS. 1 and 2. Description will be made here on a case where a vertical substrate processing apparatus including a vertical furnace is applied as an example of the substrate processing apparatus.

The substrate processing apparatus 1 exemplified here is used in one of manufacturing processes of a semiconductor device and is configured to perform a predetermined process such as a CVD process or the like to a substrate (hereinafter simply referred to as "wafer") 2 such as a silicon wafer or the like.

On the front surface of a housing 4 of the substrate processing apparatus 1, there is provided an I/O stage (substrate storage container delivery part) 5 on which a substrate storage container (hereinafter referred to as "cassette") 3 called a FOUP is held. The cassette 3 is loaded into and unloaded from the housing 4 through the I/O stage 5. In addition, a cassette shelf (storage means) 6 for storing the loaded cassette 3 is provided in the housing 4, and an airtight chamber 8 serving as a loading/unloading space for a below-described boat (substrate holder) 7, which is a transfer area for the wafer 2, is installed in the housing 4. The inside of the airtight chamber 8 is filled with an inert gas such as a $N_2$ gas or the like in order to prevent formation of a natural oxide film on the wafer 2.

On the front side of the airtight chamber 8, there are plural sets (two sets in the figure) of cassette-mounting stages (substrate-storage-container-mounting means) 9 and 11. Cassette openers 12 and 13 (opening/closing means) are installed at the portion of the airtight chamber 8 facing the cassette-mounting stages 9 and 11, respectively. The cassette openers 12 and 13 are configured to open and close a lid (not shown) that closes an opening installed at one side surface of the cassette 3 and are capable of individually opening and closing each of the cassettes 3 mounted on the cassette-mounting stages 9 and 11.

The cassette 3 is transferred between the cassette-mounting stages 9 and 11, the cassette shelf 6, and the I/O stage 5 by a cassette transfer machine 14. An air cleaned by a clean unit (not shown) installed at the housing 4 is sent to the transfer space 15 for the cassette 3 by the cassette transfer machine 14.

Furthermore, a boat 7 as a substrate holder for horizontally holding a plurality of wafers 2 in multiple stages is installed inside the airtight chamber 8. A substrate alignment device 16 for aligning a position of a notch (or an orientation flat) of the wafer 2 with an arbitrary position is installed inside the airtight chamber 8. Furthermore, one set of wafer transfer machines (substrate transfer parts) 17 for transferring the wafer 2 between the cassette 3 on each of the cassette-mounting stages 9 and 11, the substrate alignment device 16, and the boat 7 is installed inside the airtight chamber 8. A process furnace 18 for processing the wafer 2 is installed above the airtight chamber 8. A furnace port, which is a lower end opening of the process furnace 18, is opened and closed by a furnace port gate valve 19. Below the process furnace 18, there is provided a boat elevator (elevating part) 21 for loading or unloading the boat 7 to or from the process furnace 18 with the furnace port gate valve 19 kept in an open state. The cassette transfer machine 14, the wafer transfer machine 17, and the boat elevator 21 function as a "transfer robot part" that transfers the wafer 2 in the housing 4 of the substrate processing apparatus 1.

The process furnace 18 includes an outer tube made of a heat resistant material such as, for example, quartz ($SiO_2$) or the like. The outer tube has a roofed cylindrical shape. An inner tube having an open upper end and an open lower end is concentrically disposed in the outer tube. The boat 7 horizontally holding the plurality of wafers 2 in multiple stages is loaded into the inner tube of the process furnace 18 by the boat elevator 21 (boat loading). At this time, a seal cap airtightly closes (seals) the lower end of the outer tube via an O-ring. Furthermore, the boat 7 loaded into the process furnace 18 is rotated by a rotation mechanism 20. In this state, the wafer 2 held on the boat 7 is subjected to a predetermined process such as a CVD process or the like as will be described below. That is, the process furnace 18 functions as a "process chamber" for processing the wafer 2.

At the outer periphery of the outer tube of the process furnace 18, a heater 33 as a heating means is concentrically disposed. The heater 33 is configured to heat the wafer 2 in the process furnace 18 to a predetermined temperature. At this time, a state of supplying electric power to the heater 33 is feedback-controlled based on temperature information detected by a temperature sensor (not shown) so that the process furnace 18 has a predetermined temperature distribution. That is, the heater 33 functions as a "heating part" that heats the wafer 2.

A processing gas supply part for supplying a gas into the process furnace 18 and an exhaust system for exhausting the gas from an inside of the process furnace 18 (both of which are not shown) are connected to the process furnace 18. Details thereof will be described below.

Figure 3:
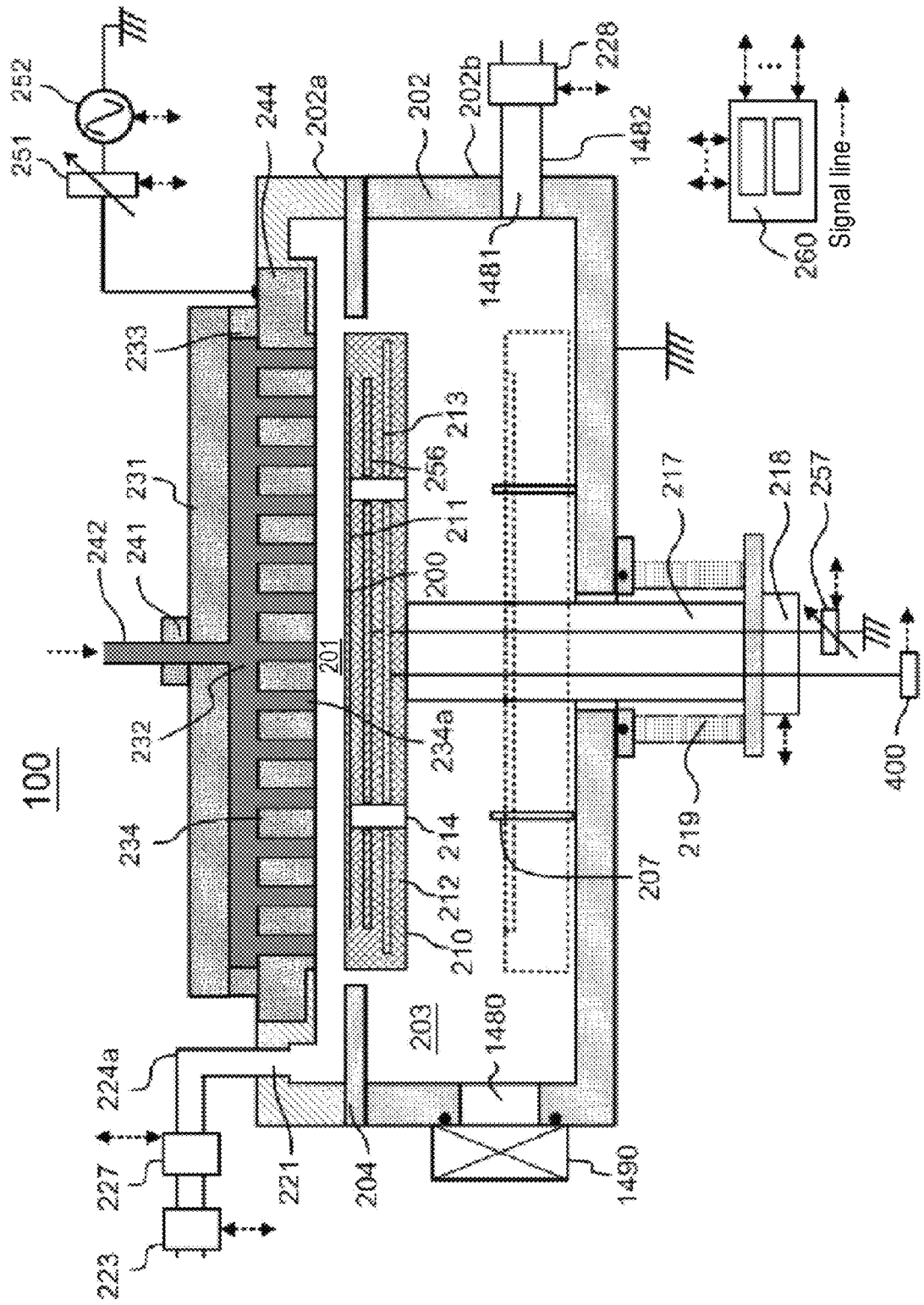
FIG. 3 is a sectional view schematically showing another example of the schematic configuration of the substrate processing apparatus according to embodiments of the present disclosure.

(2) Another Example of Schematic Configuration of Substrate Processing Apparatus Subsequently, another example of the schematic configuration of the substrate processing apparatus according to the present embodiments will be described with reference to FIG. 3. Description will be made here on a case where a single-wafer-type substrate processing apparatus is applied as another example of the substrate processing apparatus.

The substrate processing apparatus 100 exemplified here is also configured to perform a predetermined process to the wafer 200 in one of manufacturing processes of a semiconductor device as described above.

The substrate processing apparatus 100 includes a process container 202. The process container 202 is configured as a flat airtight container having a circular cross section and is made of, for example, a metallic material such as aluminum (Al), stainless steel (SUS), or the like, or quartz. Moreover, the process container 202 includes an upper container 202a and a lower container 202b between which a partition portion 204 is installed. The space disposed above the partition portion 204 and surrounded by the upper container 202a functions as a process space (hereinafter also referred to as "process chamber") 201 for processing the wafer 200. That is, the substrate processing apparatus 100 has a function as a process chamber 201 for processing the wafer 2. On the other hand, the space disposed below the partition portion 204 and surrounded by the lower container 202b functions as a transfer space (also referred to as "transfer chamber") 203 for transferring the wafers 200. In order to function as the transfer chamber 203, a substrate-loading/unloading port 1480 adjacent to a gate valve 1490 is installed at the side surface of the lower container 202b. A wafer 200 is moved to and from a transfer chamber (not shown) via the substrate-loading/unloading port 1480. A plurality of lift pins 207 are installed at the bottom of the lower container 202b. Furthermore, the lower container 202b is grounded.

A substrate support part (susceptor) 210 that supports the wafer 200 is installed in the process chamber 201. The susceptor 210 includes a substrate-mounting table 212 having a mounting surface 211 on which the wafer 200 is mounted. The substrate-mounting table 212 includes a temperature adjustment part 213 installed therein and configured to adjust the temperature of the wafer 200 mounted on the mounting surface 211. The temperature adjustment part 213 is configured to maintain the wafer 200 at a predetermined temperature by heating or cooling the wafer 200 mounted on the mounting surface 211. That is, the temperature adjustment part 213 functions as at least a "heating part" that heats the wafer 200. A temperature control part 400 that controls the temperature to be adjusted is connected to the temperature adjustment part 213. In addition to the temperature adjustment part 213, the substrate-mounting table 212 includes a bias electrode 256 installed therein and configured to apply a bias voltage into the process chamber 201. An impedance adjustment part 257 for adjusting the bias voltage to be applied is connected to the bias electrode 256. Furthermore, in the substrate-mounting table 212, through holes 214 through which the lift pins 207 pass are respectively installed at the positions corresponding to the lift pins 207.

The substrate-mounting table 212 is supported by a shaft 217. The shaft 217 passes through the bottom of the process container 202. Furthermore, the shaft 217 is connected to a lifting mechanism 218 outside the process container 202. The substrate-mounting table 212 can be moved up and down by operating the lifting mechanism 218. That is, the lifting mechanism 218 functions as a "transfer robot part" that transfers the wafer 200 mounted on the substrate-mounting table 212. The periphery of the lower end portion of the shaft 217 is covered with a bellows 219, whereby the inside of the process chamber 201 is kept airtight.

When the wafer 200 is transferred, the substrate-mounting table 212 is lowered so that the substrate-mounting surface 211 is aligned with the position (wafer transfer position) of the substrate-loading/unloading port 1480. When the wafer 200 is processed, the wafer 200 is moved up to the process position (wafer processing position) in the process chamber 201. Specifically, when the substrate-mounting table 212 is lowered to the wafer transfer position, the upper end portions of the lift pins 207 protrude from the upper surface of the substrate-mounting surface 211 so that the lift pins 207 can support the wafer 200 from therebelow. When the substrate-mounting table 212 is moved up to the wafer processing position, the lift pins 207 are retracted from the upper surface of the substrate-mounting surface 211 so that the substrate-mounting surface 211 can support the wafer 200 from therebelow. Since the lift pins 207 make direct contact with the wafer 200, it is desirable that the lift pins 207 be formed of a material such as, for example, quartz or alumina.

A gas introduction port 241 for supplying various gases into the process chamber 201 is installed at the upper portion of the process chamber 201, and a common gas supply pipe 242 is connected to the gas introduction port 241. Details of the configuration of the processing gas supply part connected to the gas introduction port 241 via the common gas supply pipe 242 will be described below.

In addition, a shower head 231 including a dispersion plate 234 is disposed at the upper portion of the process chamber 201 in order to disperse the path 232 of the gas supplied from the gas introduction port 241 and to diffuse the gas evenly into the process chamber 201. At least a matcher 251 and a high-frequency power source 252 are connected to a support member 244 of the dispersion plate 234 so that electromagnetic waves (high-frequency power or microwaves) can be supplied. Thus, the gas supplied into the process chamber 201 can be excited and converted into plasma via the dispersion plate 234.

An exhaust port 221 as a first exhaust part that exhausts the atmosphere of the process chamber 201 is installed at the upper surface of the inner wall of the process chamber 201 (upper container 202a). An exhaust pipe 224a as a first exhaust pipe is connected to the exhaust port 221. A pressure regulator 227 such as an APC (Auto Pressure Controller) that controls the inside of the process chamber 201 to a predetermined pressure and a vacuum pump 223 are sequentially and serially connected to the exhaust pipe 224a. A first exhaust part (exhaust line), which is one of the exhaust systems, mainly includes the exhaust port 221, the exhaust pipe 224a, and the pressure regulator 227. The vacuum pump 223 may be included in the first exhaust part.

A transfer chamber exhaust port 1481 as a second exhaust part that exhausts the atmosphere of the transfer chamber 203 is installed at the lower portion of the side surface of the transfer chamber 203. An exhaust pipe 1482 as a second exhaust pipe is connected to the transfer chamber exhaust port 1481. A pressure regulator 228 such as an APC for controlling the inside of the transfer chamber 203 to a predetermined pressure and a vacuum pump (not shown) are sequentially and serially connected to the exhaust pipe 1482. A second exhaust part (exhaust line), which is another exhaust system, mainly includes the transfer chamber exhaust port 1481, the exhaust pipe 1482, and the pressure regulator 228. The vacuum pump (not shown) may be included in the second exhaust part.

It is assumed that the first exhaust part of the above-described exhaust systems is also similarly installed at the above-described vertical substrate processing apparatus 1 so that the gas can be exhausted from the inside of the process furnace 18.

(3) Configuration Common to Respective Examples

Next, the configurations common to the vertical substrate processing apparatus 1 and the single-wafer-type substrate processing apparatus 100 will be described.
(Processing Gas Supply Part)

Figure 4:
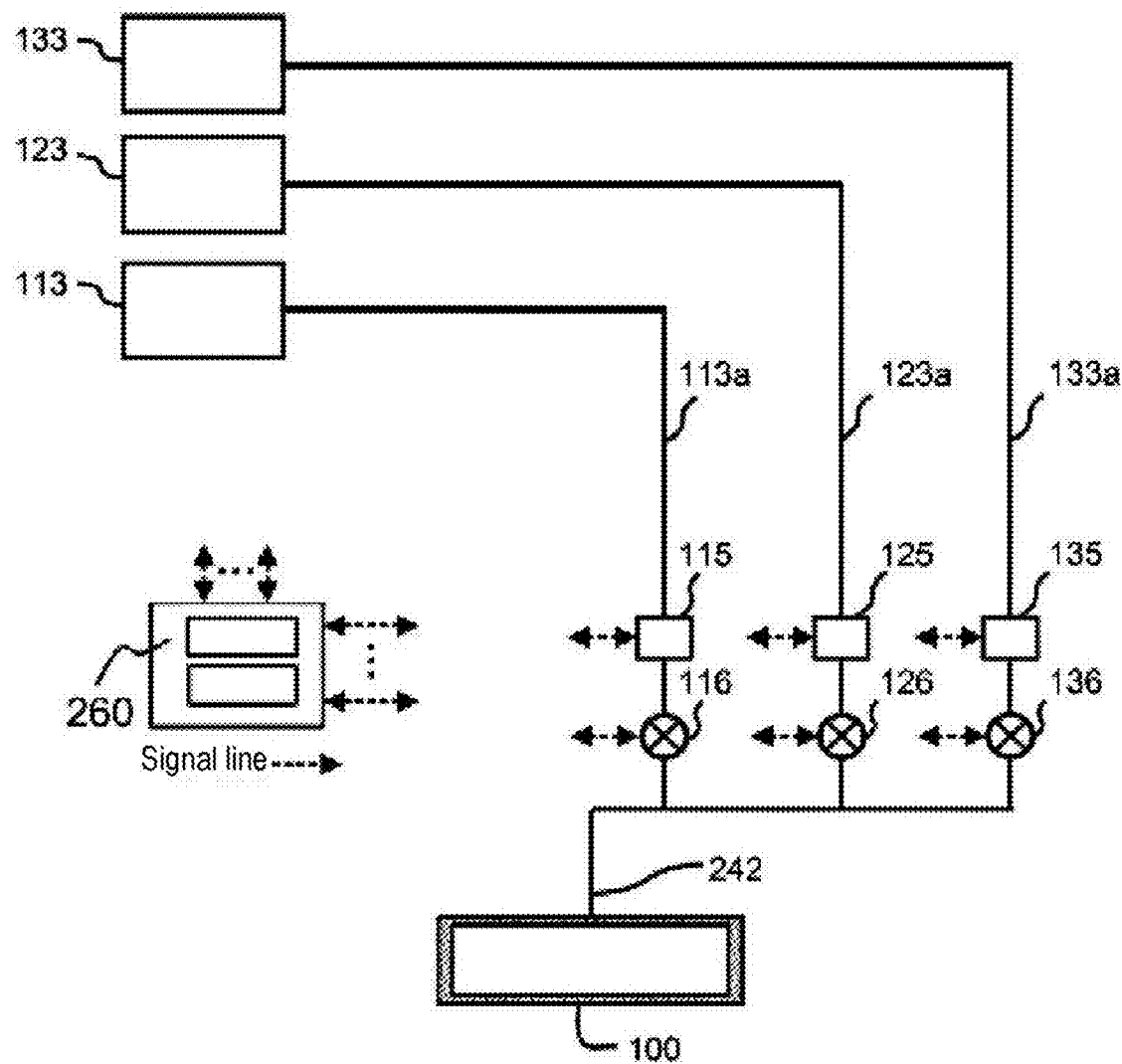
FIG. 4 is a block diagram schematically showing a configuration example of a processing gas supply part included in the substrate processing apparatus according to embodiments of the present disclosure.

First, a processing gas supply part that supplies a processing gas to the wafer 200 will be described with reference to FIG. 4. Description will be made here by taking, as an example, the processing gas supply part in the single-wafer-type substrate processing apparatus 100. However, the same configuration may be applied to the vertical substrate processing apparatus 1 as well.

A first gas supply pipe 113a, a second gas supply pipe 123a, and a third gas supply pipe 133a are connected to a common gas supply pipe 242 that communicates with the process chamber 201 via the gas introduction port 241.

A first gas supply source 113, a MFC (mass flow controller) 115 as a flow rate controller (flow rate control part), and a valve 116 as an opening/closing valve are installed at the first gas supply pipe 113a sequentially from the upstream side. A gas (first processing gas) containing a first element is supplied from the first gas supply source 113 to the process chamber 201 via the MFC 115, the valve 116, the first gas supply pipe 113a, and the common gas supply pipe 242. As the first processing gas, for example, a silicon-containing gas such as a TEOS (tetraethoxysilane) gas or the like is used. However, the present disclosure is not limited thereto. Other types of gas may be used.

A second gas supply source 123, an MFC 125, and a valve 126 are installed at the second gas supply pipe 123a sequentially from the upstream side. A gas (second processing gas) containing a second element different from the first element contained in the first process gas is supplied from the second gas supply source 123 to the process chamber 201 via the MFC 125, the valve 126, the second gas supply pipe 123a, and the common gas supply pipe 242. As the second processing gas, for example, an oxygen-containing gas such as an $O_3$ gas or the like is used. However, the present disclosure is not limited thereto. Other types of gas may be used.

A third gas supply source 133, an MFC 135, and a valve 136 are installed at the third gas supply pipe 133a sequentially from the upstream side. An inert gas is supplied from the third gas supply source 133 to the process chamber 201 via the MFC 135, the valve 136, the third gas supply pipe 133a, and the common gas supply pipe 242. The inert gas is, for example, a $N_2$ gas. In addition to the $N_2$ gas, for example, a rare gas such as a He gas, a Ne gas, an Ar gas, or the like may be used as the inert gas.

By providing the processing gas supply part configured as described above, the first processing gas, the second processing gas, or the inert gas is supplied to the wafer 200 in the process chamber 201 as necessary.

(Safety Interlock Part)

Next, a safety interlock part included in the vertical substrate processing apparatus 1 or the single-wafer-type substrate processing apparatus 100 will be described with reference to FIG. 5.

For example, in the single-wafer-type substrate processing apparatus 100, the lifting mechanism 218 functioning as a transfer robot part transfers the wafer 200 into the process chamber 201, the temperature adjustment part 213 functioning as a heating part heats the wafer 200 in the process chamber 201, and the processing gas supply part supplies a processing gas to the wafer 200, thereby performing a predetermined process to the wafer 200 in the process chamber 201. The same applies to the vertical substrate processing apparatus 1. That is, for example, in the vertical substrate processing apparatus 1, the boat elevator 21 transfers the wafers 2 to the process furnace 18 as a process chamber, the heater 33 functioning as a heating part heats the wafers 2 in the process furnace 18, and the processing gas supply part supplies a processing gas to the wafer 2, thereby performing a predetermined process to the wafers 2 in the process furnace 18. The operations such as wafer transfer, heating, and processing gas supply may affect the human body of an apparatus operator. For this reason, the substrate processing apparatuses 1 and 100 incorporate a safety interlock part for ensuring the safe use of an apparatus operator.

The safety interlock part shuts off the power supply and stops the above-described operations when an abnormality (for example, a time-out error of a predetermined operation) is detected in at least one selected from the group of the transfer robot part, the heating part, and the processing gas supply part that perform the above-described operations.

Figure 5:
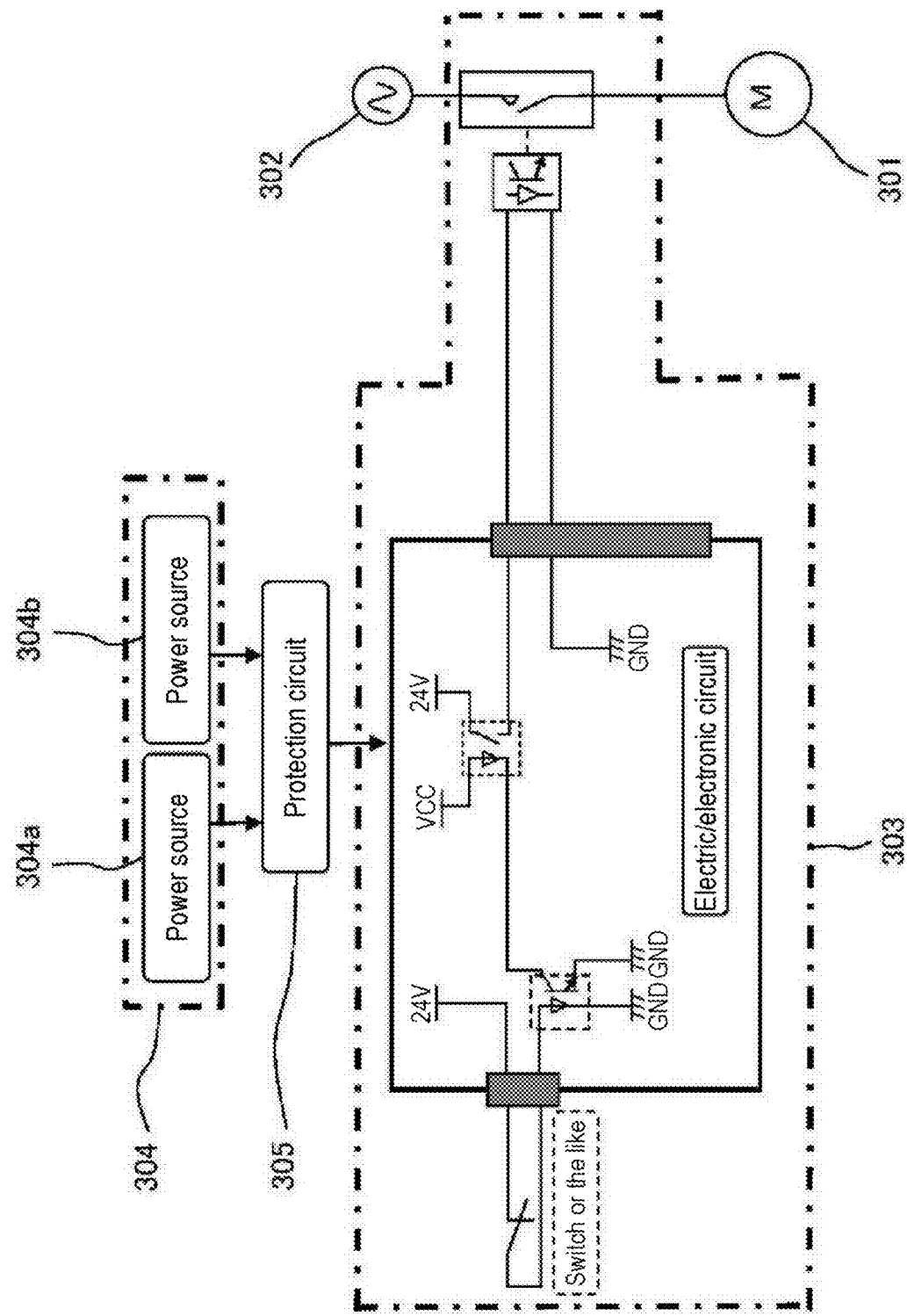
FIG. 5 is a block diagram schematically showing a configuration example of a safety interlock part included in the substrate processing apparatus according to embodiments of the present disclosure.

Specifically, for example, in the configuration example of the lifting mechanism 218 as a transfer robot part in the single-wafer-type substrate processing apparatus 100, as shown in FIG. 5, a first control part 303 including an electric/electronic circuit that performs a switching operation is installed between a driving motor 301 of the lifting mechanism 218 and a first power supply part 302 connected to the driving motor 301 to supply electric power to the driving motor 301. The first control part 303 is capable of detecting occurrence of an abnormality in the operation of the lifting mechanism 218 according to a predetermined determination criterion and is configured to shut off the power supply from the first power supply part 302 to the driving motor 301 when the occurrence of the abnormality is detected.

A second power supply part 304 that supplies power necessary for the operation of the first control part 303 is connected to the first control part 303. The second power supply part 304 includes two power sources 304a and 304b that drive the first control part 303. Although the case where the second power supply part 304 includes two power sources 304a and 304b has been described by way of example, the second power supply part 304 may include three or more power sources. That is, the second power supply part 304 only needs to include two or more power sources.

In addition, a second control part 305 including a protection circuit that controls power supply from the second power supply part 304 to the first control part 303 is installed between the first control part 303 and the second power supply part 304. As will be described below, the second control part 305 is configured to adjust a power ratio of each of the two or more power sources 304a and 304b of the second power supply part 304 when supplying power from the second power supply part 304 to the first control part 303. Specifically, the second control part 305 is capable of setting a power ratio of each of the two or more power sources 304a and 304b to a predetermined value (e.g., 50%: 50%) and is capable of supplying power to the first control part 303 in that state.

Although description has been made here on the configuration example of the safety interlock part which controls the operation of the driving motor 301 of the lifting mechanism 218, the same configuration example may be applied to a case where the operation of the heating part, the processing gas supply part, or the like is controlled. The same applies to the vertical substrate processing apparatus 1 as well as the single-wafer-type substrate processing apparatus 100. For example, the driving motor 301 may be configured as a safety interlock part that controls the operation of the cassette transfer machine 14, the wafer transfer machine 17, the boat elevator 21, the rotation mechanism 20, or the like. The same configuration example may be applied to the control of the operation of the heating part, the processing gas supply part, or the like.

(Controller)

Figure 6:
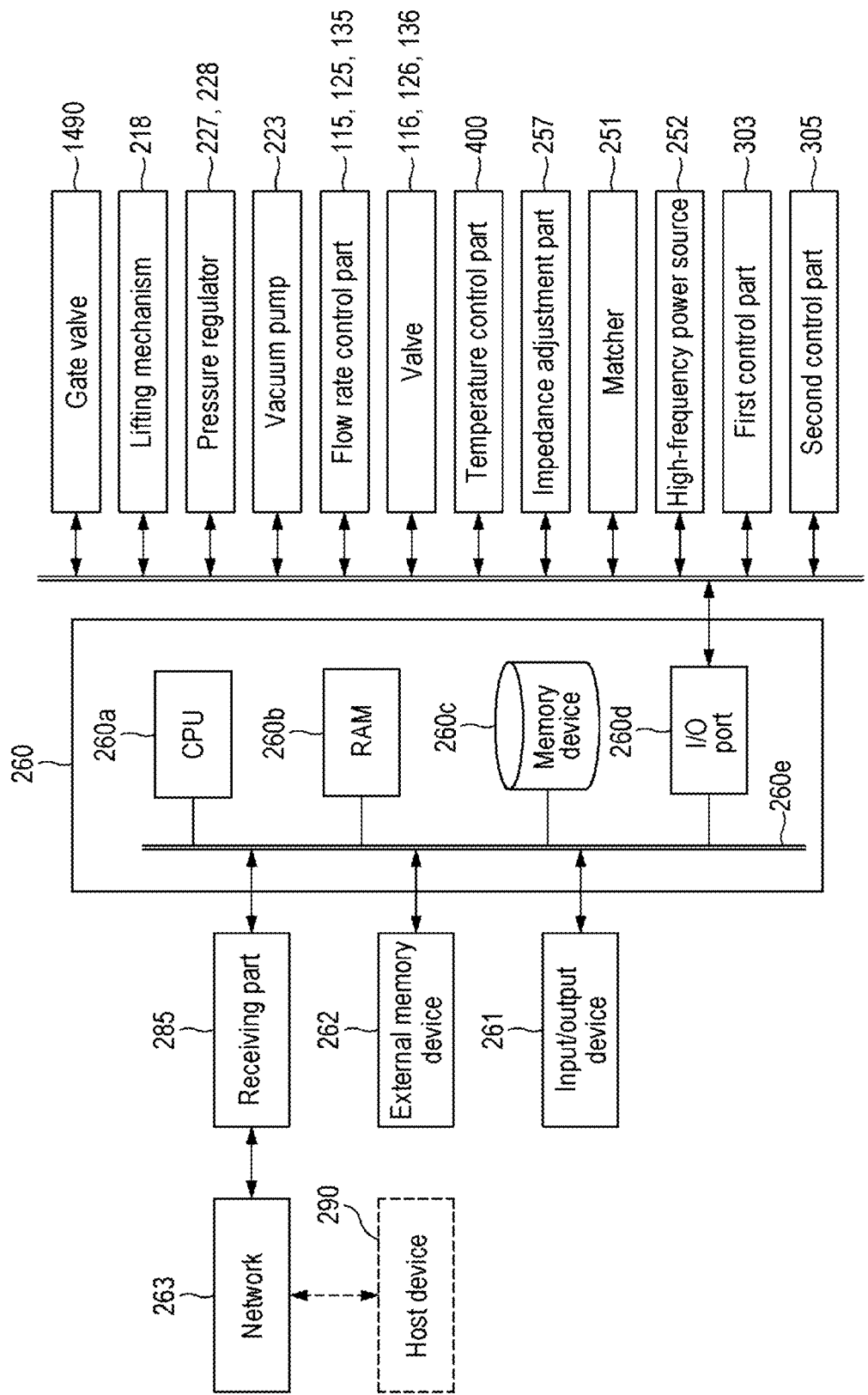
FIG. 6 is a block diagram schematically showing a configuration example of a controller included in the substrate processing apparatus according to embodiments of the present disclosure.

Next, a controller 260 that controls the operations of the respective parts mentioned above will be described with reference to FIG. 6. Although description has been made here on an example of the controller 260 used in the single-wafer-type substrate processing apparatus 100, the same configuration may also be applied to the vertical substrate processing apparatus 1.

The controller 260 controls the overall operation of the substrate processing apparatus 100. The controller 260 is also connected to the first control part 303 and the second control part 305 of the safety interlock part, in addition to the transfer robot part, the heating part, and the processing gas supply part described above. By being connected to these parts, the controller 260 functions as a "third control part."

Specifically, the controller 260 is configured as a computer including a CPU (Central Processing Unit) 260a, a RAM (Random Access Memory) 260b, a memory device 260c, and an I/O port 260d. The RAM 260b, the memory device 260c, and the I/O port 260d are configured to exchange data with the CPU 260a via an internal bus 260e. For example, an input/output device 261 configured as a touch panel, or an external memory device 262 may be connected to the controller 260. Information may be inputted from the input/output device 261 to the controller 260. The input/output device 261 functions as a "display part" that displays and outputs information under the control of the controller 260. Furthermore, a network 263 may be connected to the controller 260 via a receiving part 285. This means that the controller 260 can also be connected to a host device 290 such as a host computer or the like that exists on the network 263.

The memory device 260c is configured by, for example, a flash memory, a HDD (Hard Disk Drive), or the like. The memory device 260c readably stores a control program for controlling the operation of the substrate processing apparatus 100, a process recipe in which substrate processing procedures and conditions to be described below are written, and calculation data or processing data generated in the process of setting a process recipe used for processing the wafer 200. The process recipe is combined so that a predetermined result can be obtained by causing the controller 260 to execute each procedure in a substrate processing step to be described below. The process recipe functions as a program. Hereinafter, the process recipe, the control program, and the like are collectively and simply referred to as a program. As used herein, the term "program" may refer to a case of including only the process recipe, a case of including only the control program, or a case of including both the process recipe and the control program. The RAM 260b is configured as a memory area (work area) in which the program read by the CPU 260a, the calculation data, the processing data, and the like are temporarily stored.

The I/O port 260d are connected to the gate valve 1490, the lifting mechanism 218, the pressure regulators 227 and 228, the vacuum pump 223, the MFCs 115, 125, and 135, the valves 116, 126, and 136, the temperature control part 400, the impedance adjustment part 257, the matcher 251, the high-frequency power source 252, the first control part 303, the second control part 305, and the like.

The CPU 260a as a calculation part is configured to read the control program from the memory device 260c and execute the control program thud read. The CPU 260a is also configured to read the process recipe from the memory device 260c in response to an operation command inputted from the input/output device 261 or the like. In addition, the CPU 260a is configured to calculate calculation data by comparing the setting value inputted from the receiving part 285 and the process recipe or the control data stored in the memory device 260c. Moreover, the CPU 260a is configured to execute a process of determining the processing data (process recipe) corresponding to the calculation data. The CPU 260a is configured to control, according to the contents of the process recipe thus read, the opening/closing operation of the gate valve 1490, the elevating operation of the lifting mechanism 218, the voltage adjustment of the impedance adjustment part 257, the power matching operation of the matcher 251, the on/off control of the high-frequency power source 252, the control of the operations of the MFCs 115, 125, and 135, the on/off control of the valves 116, 126, and 136, the pressure regulation operations of the pressure regulators 227 and 228, the on/off control of the vacuum pump 223, the control of the operations of the first control part 303 and the second control part 305, and the like.

The controller 260 is not limited to being configured as a dedicated computer and may be configured as a general-purpose computer. For example, the controller 260 according to the present embodiments may be configured by preparing an external memory device (e.g., a magnetic tape, a magnetic disk such as a flexible disk or hard disk, an optical disk such as a CD or a DVD, a magneto-optical disk such as a MO or the like, or a semiconductor memory such as a USB memory or a memory card) 262 that stores the above-described program, and installing the program in a general-purpose computer using the external memory device 262. However, the means for supplying the program to the computer is not limited to the case of supplying the program via the external memory device 262. For example, the program may be supplied by using a communication means such as the network 263 (Internet or dedicated line) without using the external memory device 262. The memory device 260c and the external memory device 262 are configured as computer-readable recording media. Hereinafter, the memory device 260c and the external memory device 262 are collectively and simply referred to as a recording medium. As used herein, the term "recording medium" may refer to a case of including only the memory device 260c, a case of including only the external memory device 262, or a case of including both the memory device 260c and the external memory device 262.

(4) Substrate-Processing Process

Next, an example of the processing operation in the aforementioned vertical substrate processing apparatus 1 or the aforementioned single-wafer-type substrate processing apparatus 100 will be described. In the following description, the processing operation in the single-wafer-type substrate processing apparatus 100 is taken as an example. However, the same processing operation may also be performed in the vertical substrate processing apparatus 1. The processing operation described as an example here is performed as one step of a manufacturing process of a semiconductor device, and constitutes a substrate-processing process for performing a predetermined process to a wafer.

When the term "wafer" is used herein, it may refer to "a wafer itself" or "a laminated body (aggregation) of a wafer and a predetermined layer or film formed on the surface of the wafer" (i.e., a wafer including a predetermined layer or film formed on the surface thereof). In addition, when the term "wafer surface" is used herein, it may refer to "a surface (exposed surface) of a wafer itself" or "a surface of a predetermined layer or a film formed on a wafer, i.e., an outermost surface of a wafer as a laminated body." Therefore, when the phrase "supplying a predetermined gas to a wafer" is used herein, it may refer to "supplying a predetermined gas directly to a surface (exposed surface) of a wafer itself" or "supplying a predetermined gas to a layer or a film formed on a wafer, i.e., an outermost surface of a wafer as a laminated body." In addition, when the term "substrate" is used herein, it may be the same as the case where the word "wafer" is used. In that case, in the above description, "wafer" may be replaced with "substrate."

The processing operations performed by the substrate processing apparatus 100 in the substrate-processing process includes a film-forming process for forming a film on a wafer surface by a CVD process or the like, a safety interlock process for ensuring safety by stopping a processing operation when any abnormality is detected during the processing operation, and a monitoring control process for optimizing the safety interlock process. Hereinafter, each of these processes will be described in order. In the following description, the operations of the respective parts constituting the substrate processing apparatus 100 are controlled by the controller 260.

(Film-Forming Process)

In a film-forming process, first, the wafer 200 to be processed is loaded to the process chamber 201. Specifically, after the wafer 200 is placed on the lift pins 207, the substrate-mounting table 212 is moved up by the lifting mechanism 218 to place the wafer 200 on the substrate-mounting surface 211, thereby locating the wafer 200 at a processing position (wafer processing position) in the process chamber 201.

After the wafer 200 is located at the wafer processing position, the inside of the process chamber 201 is set to a predetermined pressure (degree of vacuum). The amount of heating by the temperature adjustment part 213 embedded in the substrate-mounting table 212 is feedback-controlled based on a temperature value detected by a temperature sensor (not shown) so that the temperature of the wafer 200 on the substrate-mounting surface 211 reaches a predetermined temperature.

After the atmosphere in the process chamber 201 is stabilized, a first processing gas such as a TEOS gas or the like is supplied to the process chamber 201 at a predetermined flow rate through the first gas supply pipe 113a and the like, and a second processing gas such as an O₃ gas or the like is supplied to the process chamber 201 at a predetermined flow rate through the second gas supply pipe 123a and the like. As a result, in the process chamber 201, a predetermined film such as a silicon oxide film (SiO film) or the like is formed on the surface of the wafer 200 by a CVD process. Furthermore, as necessary, the plasma of a processing gas is generated in the process chamber 201 by supplying high-frequency power or the like into the process chamber 201 using the matcher 251 and the high-frequency power source 252.

Thereafter, a process of unloading the processed wafer 200 from the process chamber 201 is performed by way of a process of purging the inside of the process chamber 201 by supplying an inert gas through the third gas supply pipe 133a and the like, or a process of lowering the temperature in the process chamber 201 using the temperature adjustment part 213. Thus, a series of processing operations for the wafer 200 is completed.

(Safety Interlock Process)

In the film-forming process performed through the above-described series of procedures, the safety of the operation is monitored by the safety interlock part because the substrate processing apparatus 100 is provided with the safety interlock part. Specifically, during the film-forming process described above, the safety interlock part monitors whether or not any abnormality has occurred. If an abnormality is detected, the processing operation is stopped by shutting off the power supply. For example, as for the lifting mechanism 218 that functions as a transfer robot part, the wafer 200 is transferred by the power supply from the first power supply part 302, and the power supply is controlled by the first control part 303. When the first control part 303 detects the occurrence of an abnormality, the operation of the driving motor 301 of the lifting mechanism 218 is stopped by shutting off the power supply from the first power supply part 302. The power supply is controlled in exactly the same manner for the temperature adjustment part 213 that heats the wafer 200 and the processing gas supply part that supplies the processing gas to the wafer 200.

In the safety interlock part that performs such a control process, for example, power is also supplied from the second power supply part 304 to the first control part 303 that is in charge of the control process. That is, the first control part 303 requires power supply from the second power supply part 304 in order to perform the control process of the power supply from the first power supply part 302. If the power supply from the second power supply part 304 is interrupted, in order to eliminate the possibility of not functioning as a safety interlock part, the first control part 303 comes into a state in which the operation to be controlled is stopped, i.e., a state in which the function is stopped (shutdown state), regardless of whether or not an abnormality has been detected.

The frequent occurrence of the function stop state may impair the productivity of a film-forming process or the like performed by the substrate processing apparatus 100. In addition, the occurrence of the function stop state may adversely affect the contents of the film-forming process or the like, which may cause a reduction in quality of the processing result. Therefore, during the power supply necessary for the operation of the substrate processing apparatus 100, the power supply particularly to the first control part 303 is preferably performed by a long-life power source and preferably performed by a power source with excellent resistance to a failure or the like.

In view of this, in the safety interlock part according to the present embodiments, the second power supply part 304 for supplying power to the first control part 303 includes two or more power sources 304a and 304b, and the second control part 305 is installed between the first control part 303 and the second power supply part 304. Each of the two or more power sources 304a and 304b supplies power to the first control part 303, and the second control part 305 adjusts the power ratio of each of the power sources 304a and 304b. For example, when the second power supply part 304 includes two power sources 304a and 304b, the power ratio is controlled by the second control part 305 so as to have a predetermined value of 50%: 50%. The power ratio may be determined in advance and is not limited to a specific value. After performing such adjustment of the power ratio, power is supplied to the first control part 303 in the state after such adjustment.

As described above, if the power ratio of the two or more power sources 304a and 304b is adjusted to a predetermined value when supplying power to the first control part 303, the power supply amount per one of the power sources 304a and 304b is suppressed as compared with a case where the second power supply part 304 uses only one power source. As a result, it is possible to prolong the lifespan of each of the power sources 304a and 304b. That is, the lifespan of each of power sources 304a and 304b can be extended by adjusting the power ratio of the two or more power sources 304a and 304b and then supplying powers in parallel.

Moreover, if the second power supply part 304 includes two or more power sources 304a and 304b and the powers are supplied in parallel from these power sources 304a and 304b, even when one of the power sources 304a and 304b undergoes a failure or has reached the end of its lifespan (hereinafter simply referred to as "failure or the like"), the power supply from the power source not undergoing a failure or the like is continued. This makes it possible to avoid a situation that the power supply to the first control part 303 is completely interrupted.

That is, in the safety interlock part according to the present embodiments, the second power supply part 304 includes two or more power sources 304a and 304b, and the power supply to the first control part 303 is performed after the second control part 305 adjusts the power ratio of each of the power sources 304a and 304b to a predetermined value. Therefore, the lifespan of the second power supply part 304 that supplies the power can be extended, and the resistance to a failure or the like in the second power supply part 304 can be made excellent.

(Monitoring Control Process)

In supplying power to the first control part 303, as described above, the second power supply part 304 includes two or more power sources 304a and 304b. Therefore, even if a failure or the like occurs in any one of the power sources 304a and 304b, the power supply to the first control part 303 is not completely interrupted. However, it is not preferable that the balance of the power ratio between the power sources 304a and 304b is destroyed, consequently affecting the film-forming process and the like and resulting in a decrease in film-forming quality. Accordingly, in the present embodiments, the following monitoring control process is performed in order to optimize the safety interlock process.

First Sequence Example

Figures 7, 8:
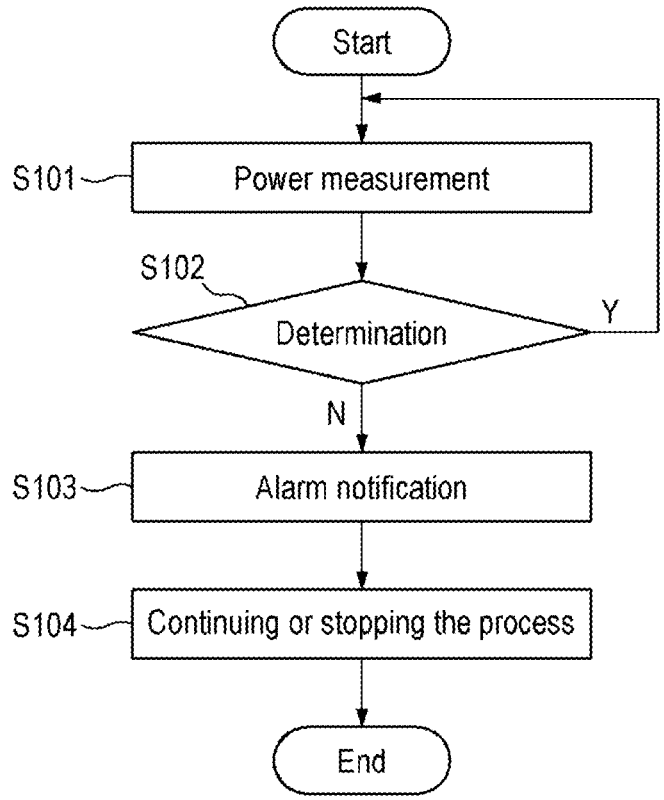
FIG. 7 is a flowchart showing a first sequence example of a monitoring control process in a substrate-processing process according to embodiments of the present disclosure.
FIG. 8 is an explanatory view showing a specific example of an alarm screen displayed and outputted by the substrate processing apparatus according to embodiments of the present disclosure.

First, a first sequence example relating to the monitoring control process will be described with reference to FIGS. 7 and 8.

As described above, when power is supplied to the first control part 303, the second control part 305 adjusts the power ratio of the power sources 304a and 304b of the second power supply part 304 to a predetermined value (e.g., 50%: 5%). At this time, as shown in FIG. 7, the second control part 305 measures values of powers supplied from the power sources 304a and 304b at preset timings (e.g., every time a predetermined time elapses) (step 101) (hereinafter, a step is abbreviated as "S"). Then, the second control part 305 obtains a power ratio (i.e., a balance of the power values) between the power sources 304a and 304b from the measured power values, and determines whether the power ratio falls within a range of a first predetermined value (S102). The first predetermined value may have, for example, an upper limit of 70% and a lower limit of 30%. In that case, the second control part 305 determines whether or not the power ratio converted from the power values of the power sources 304a and 304b falls within a range between the upper limit of 70% and the lower limit of 30%. The first predetermined value is not limited to the upper limit of 70% to the lower limit of 30%, and may be set as appropriate.

If the result of this determination reveals that the power ratio falls within the range of the first predetermined value (if Y in S102), the second control part 305 continuously repeats the above-described process (S101 to S102). On the other hand, if the result of this determination reveals that the power ratio exceeds the range of the first predetermined value (if N in S102), the second control part 305 transmits first detection data, which is detection data to that effect, to the controller 260 functioning as a third control part.

Upon receiving the first detection data from the second control part 305, the controller 260 performs alarm notification using the input/output device 261 functioning as a display part (S103). Furthermore, based on an instruction selected on an alarm screen to be described below, all the processes in progress including the film-forming process are completed, and the next film-forming process is continued or stopped (S104).

The alarm notification is performed by displaying and outputting an alarm screen on the display screen of the input/output device 261. That is, when the alarm notification is required, the input/output device 261 switches a displayed operation screen to an alarm screen while following the control instruction from the controller 260.

The alarm screen is a screen for notifying an apparatus operator of an alarm related to the substrate processing currently being performed. Specifically, as shown in FIG. 8, the alarm screen is a screen for allowing the apparatus operator to select whether to continue the process to the wafer 200 or stop the process to the wafer 200. That is, the input/output device 261 displays and outputs, as the alarm screen, a screen for allowing the apparatus operator to select whether or not to start the next substrate processing (specifically, whether or not to start the next substrate processing after finishing the substrate processing currently being performed). This is alarm notification to the apparatus operator.

Then, when it is selected on the alarm screen that the process is to be continued, the controller 260 continues the process. That is, the next substrate processing is started. On the other hand, when it is selected that the process is to be stopped, the controller 260 stops all the processes after completing the substrate processing currently being performed and establishes a state in which a maintenance work or the like for the substrate processing apparatus 100 can be performed. In other words, there is established a state in which a maintenance work or the like for the substrate processing apparatus 100 can be performed without starting the next substrate processing.

As described above, in the first sequence example, when the power ratio of the power sources 304a and 304b of the second power supply part 304 is changed over time and the balance of the power ratio exceeds the range of the first predetermined value, the alarm screen for allowing the apparatus operator to select whether or not to start the next substrate processing is displayed and outputted, whereby alarm notification is given to the apparatus operator. Therefore, it is possible to allow the apparatus operator to select whether or not to start the next substrate processing. Even if a failure or the like occurs in any one of the power sources 304a and 304b, it is possible to prevent the failure or the like from affecting the film-forming process or the like.

More specifically, for example, when a failure or the like occurs in any of the power sources 304a and 304b, the failure or the like may affect the film-forming process or the like. As a result, damage to the substrate to be processed or an abnormality of the processing atmosphere may occur. Specifically, the damage to the substrate includes, for example, cracking of the wafer 200 due to the abnormal operation of the lifting mechanism 218 as a transfer robot part, cracking of the wafer 200 or peeling of the film on the wafer 200 due to the abnormal cooling by the temperature adjustment part 213, indefiniteness of the properties of the film on the surface of the wafer 200 due to the interruption of the film-forming process, and the like. Among them, when the film properties are indefinite, it is unclear what kind of process has been performed. This makes it difficult to reuse the wafer 200. In that case, it may be conceivable that the portion having poor film properties is removed by etching or the like to reuse the wafer 200. However, if the film properties are indefinite, it is difficult to perform good etching or the like. In addition, as for the abnormality of the processing atmosphere, specifically, when the supply or heating of the processing gas is stopped at a stage before reaching a desired condition, the atmosphere in the process chamber 201 deviates from a predetermined environment. As a result, there may be created an atmosphere in which film properties cannot be obtained even when film formation is performed. However, in the first sequence example, alarm notification is performed so that an appropriate action can be selected by the apparatus operator. Therefore, even when a failure or the like has occurred in any one of the power sources 304a and 304b, it is possible to prevent the substrate from being damaged or the processing atmosphere from becoming abnormal.

Second Sequence Example

Subsequently, a second sequence example relating to the monitoring control process will be described with reference to FIGS. 9, 10, and 11.

Figure 9:
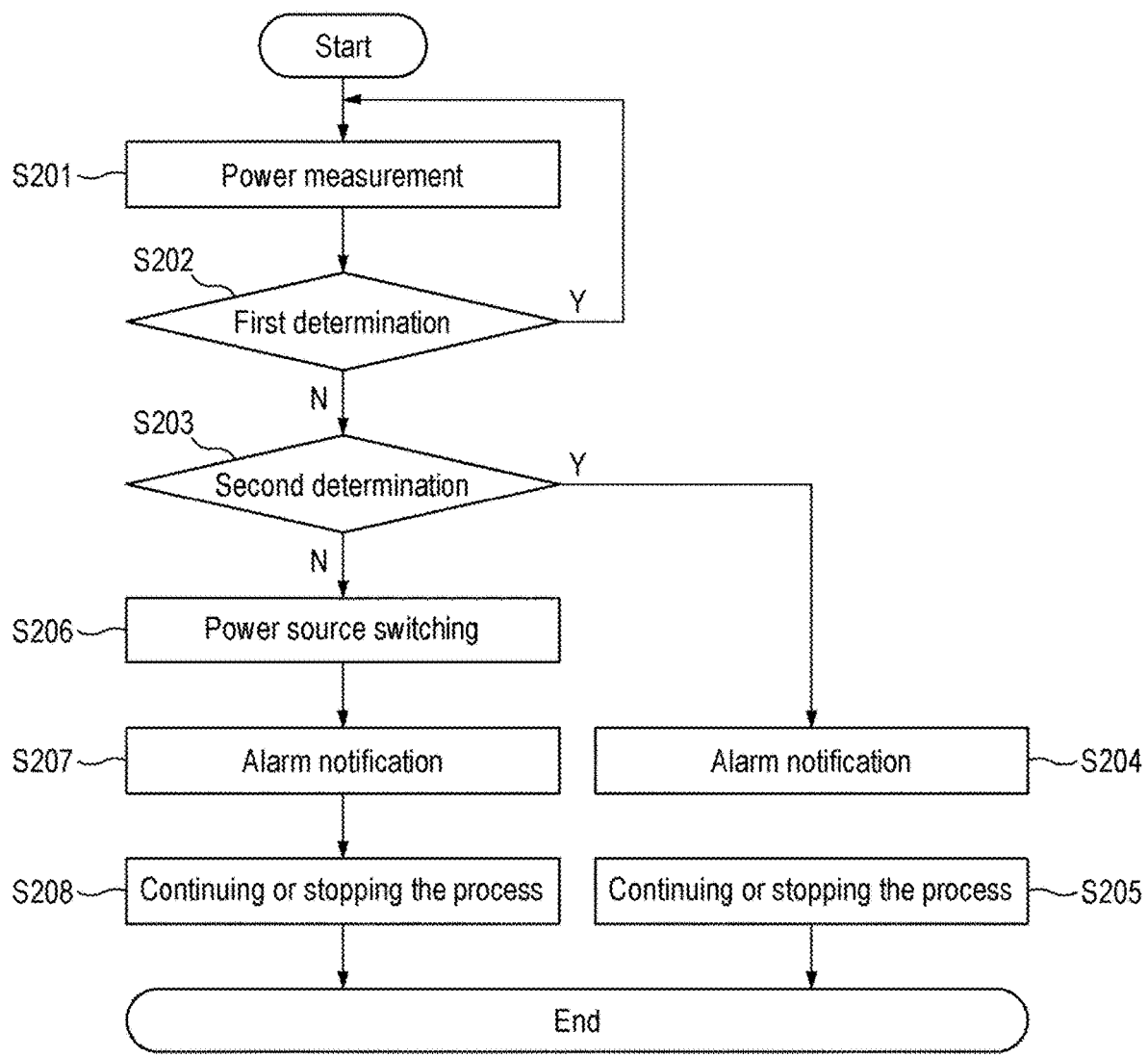
FIG. 9 is a flowchart showing a second sequence example of the monitoring control process in the substrate-processing process according to embodiments of the present disclosure.

As shown in FIG. 9, even in the second sequence example, as the case of the first sequence example described above, the values of powers supplied from the respective power sources 304a and 304b are measured (S201). It is determined whether the power ratio falls within a range of a first predetermined value (e.g., an upper limit of 70% to a lower limit of 30%) (S202). If the result of this determination reveals that the power ratio falls within the range of the first predetermined value (if Y in S202), the above-described process is continuously repeated (S201 to S202).

On the other hand, when it is detected that the power ratio exceeds the range of the first predetermined value (if N in S202), in the second sequence example, it is further determined whether the power ratio falls within a range of a second predetermined value (S203). The second predetermined value is set to a value different from the first predetermined value described above, more specifically, a value that defines a range wider than the first predetermined value. For example, the upper limit of the second predetermined value may be set to 80%, and the lower limit of the second predetermined value may be set to 20%. In that case, the second control part 305 determines whether or not the power ratio converted from the power values of the power sources 304a and 304b falls within a range between the upper limit of 80% and the lower limit of 20%. The second predetermined value is not limited to the upper limit of 80% to the lower limit of 20%, and may be set as appropriate.

If the result of this determination reveals that the power ratio falls within the range of the second predetermined value (if Y in S203), the power ratio exceeds the range of the first predetermined value but does not deviate from the range of the second predetermined value. Therefore, as the case of the first sequence example described above, the second control part 305 transmits first detection data to the controller 260.

Upon receiving the first detection data from the second control part 305, the controller 260 performs alarm notification using the input/output device 261 as the case of the first sequence example described above (S204). In addition, based on the instruction selected on the alarm screen, all the processes in progress including the film-forming process are completed, and then the next film-forming process is continued or stopped (S205). As a result, it is possible to allow the apparatus operator to select whether or not to start the next substrate processing. Even if a failure or the like occurs in any one of the power sources 304a and 304b, it is possible to prevent the failure or the like from affecting the film-forming process or the like.

On the other hand, when it is detected that the power ratio exceeds not only the range of the first predetermined value but also the range of the second predetermined value (if N in S203), the second control part 305 transmits second detection data, which is detection data to that effect, to the controller 260 functioning as a third control part.

Furthermore, if it is detected that the power ratio exceeds the range of the second predetermined value (if N in S203), the second control part 305 performs power source switching (i.e., power supply state switching) so that at least one selected from the group of the power sources 304a and 304b is turned off and at least the other of the power sources 304a and 304b is turned on (S206). In this state, power is supplied to the first control part 303.

Figure 10:
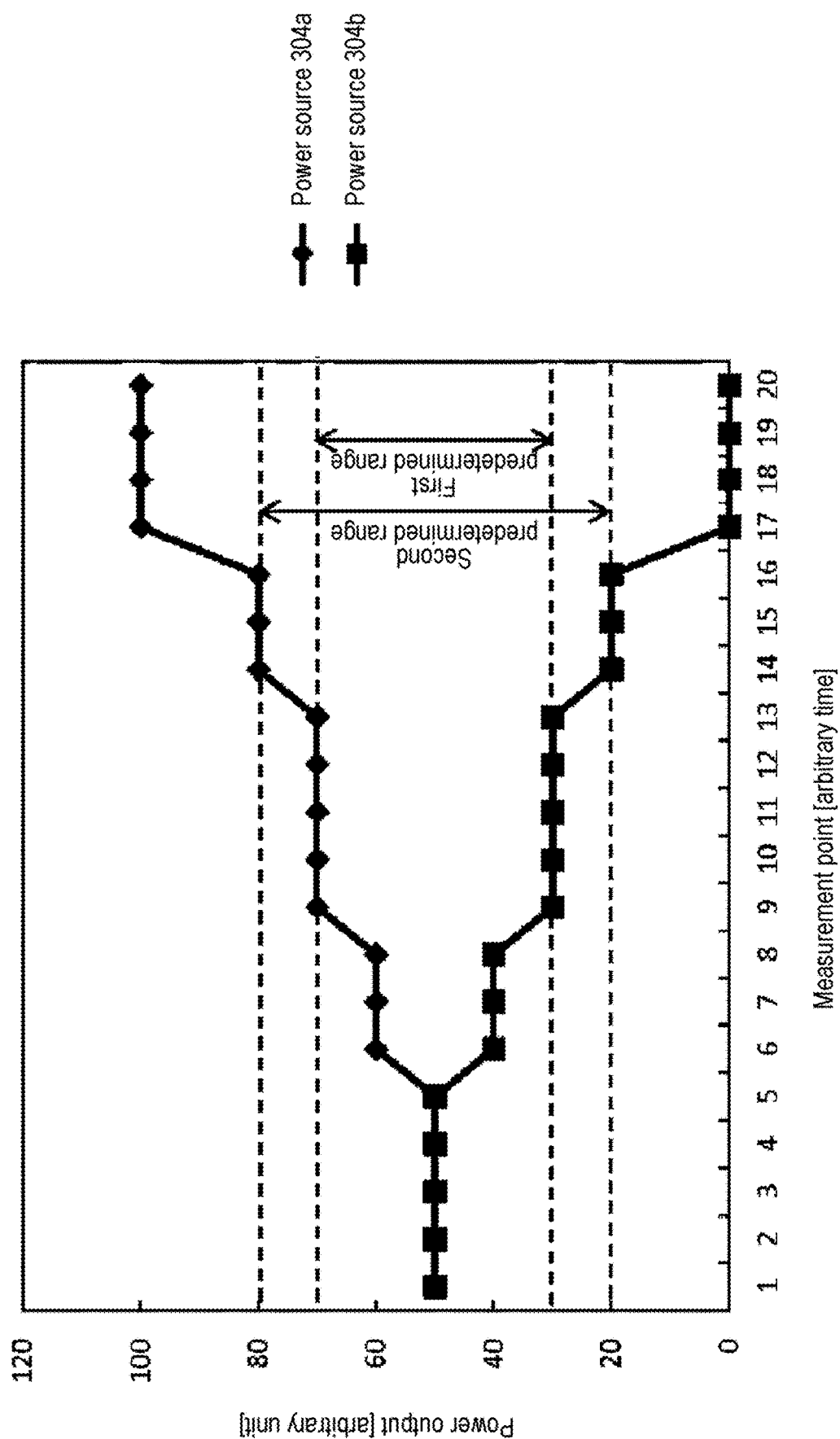
FIG. 10 is an explanatory view showing a specific example of power ratio control in the second sequence example of the monitoring control process in the substrate-processing process according to embodiments of the present disclosure.
Figure 11:
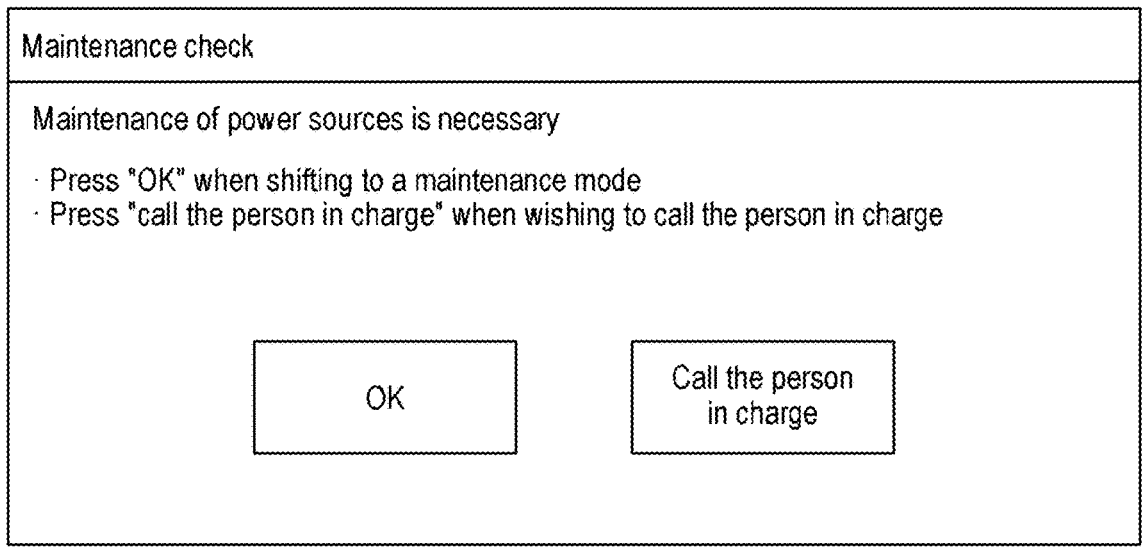
FIG. 11 is an explanatory view showing a specific example of a maintenance information screen displayed and outputted by the substrate processing apparatus according to embodiments of the present disclosure.

Specifically, as shown in FIG. 10, the second control part 305 turns off (sets to, e.g., 0%) the power source 304a or 304b, whichever has a power value measurement result becoming smaller than the lower limit (e.g., 20%) of the second predetermined value over time, so that the power is not supplied to the first control part 303. Furthermore, the second control part 305 turns on (sets to, e.g., 100%) the power source 304a or 304b, whichever has a power value measurement result becoming larger than the upper limit (e.g., 80%) of the second predetermined value, so that the power is continuously supplied to the first control part 303. If the second power supply part 304 includes three or more power sources, for example, when only one power source fails to meet the lower limit of the second predetermined value, the other two or more remaining power sources may divisionally maintain an ON state (100%). That is, even when the power ratio deviates from the range of the second predetermined value, the second control part 305 adjusts the power ratio of the power sources 304a and 304b by appropriately switching the on/off state of each of the power sources 304a and 304b, whereby the power supply to the first control part 303 is prevented from being interrupted.

Thereafter, upon receiving the second detection data from the second control part 305, the controller 260 performs alarm notification using the input/output device 261 (S207). In addition, based on the instruction selected on the alarm screen, all the processes in progress including the film-forming process are completed, and then the next film-forming process is continued or stopped (S208).

The alarm notification is performed by displaying and outputting an alarm screen on the display screen of the input/output device 261. The alarm screen at this time may be displayed and outputted according to the first detection data (i.e., in the same manner as the case of the first sequence example described above). However, the content may be different from the aforementioned one as long as it is intended to notify the alarm on the substrate processing to the apparatus operator. By performing such alarm notification, even if a failure or the like occurs in any one of the power sources 304a and 304b, it is possible to prevent the failure or the like from affecting the film-forming process or the like.

In the alarm notification performed according to the second detection data, the controller 260 may display and output a maintenance information screen in place of or in combination with the alarm screen on the display screen of the input/output device 261.

The maintenance information screen is a screen for informing the apparatus operator that the maintenance of any one of the power sources 304a and 304b of the second power supply part 304 is required, as maintenance information on the power sources. Specifically, as shown in FIG. 11, the maintenance information screen is a screen for notifying that maintenance is required for any one of the power sources 304a and 304b, and allowing the apparatus operator to select whether to shift the substrate processing apparatus 100 to a maintenance mode or call a maintenance person.

If such a maintenance information screen is displayed and outputted, even when the power ratio of the power sources 304a and 304b deviates from the range of the second predetermined value and a failure or the like is highly likely to occur in any one of the power sources 304a and 304b, it is possible to promptly cope with the maintenance for repairing the failure or the like.

When displaying and outputting the maintenance information screen on the input/output device 261, the controller 260 may transmit maintenance data, which indicates that maintenance is required, to the host device 290 existing on the network 263 via the receiving part 285. If the maintenance data is transmitted to the host device 290 that manages the operation of the substrate processing apparatus 100, the process using the maintenance data can be performed on the side of the host device 290. This makes it possible to more quickly and appropriately perform maintenance.

As described above, in the second sequence example, when the balance of the power ratio of the power sources 304a and 304b of the second power supply part 304 exceeds the range of the first predetermined value, it is further determined whether the balance of the power ratio exceeds the range of the second predetermined value. When the balance of the power ratio exceeds the range of the second predetermined value, power source switching is performed so that at least one selected from the group of the power sources 304a and 304b is turned off and at least the other of the power sources 304a and 304b is turned on. In that state, power is supplied to the first control part 303. Therefore, even when the balance of the power ratio of the power sources 304a and 304b is significantly lost and a failure or the like is highly likely to occur in any one of the power sources 304a and 304b, the power supply to the first control part 303 is not interrupted.

Moreover, in the second sequence example, alarm notification is given to the apparatus operator not only when the balance of the power ratio of the power sources 304a and 304b exceeds the range of the first predetermined value, but also when the balance of the power ratio exceeds the range of the second predetermined value. Therefore, it is possible to allow the apparatus operator to select whether or not to start the next substrate-processing process. Even if a failure or the like occurs in any one of the power sources 304a and 304b, it is possible to prevent the failure or the like from affecting the film-forming process or the like.

Furthermore, in the second sequence example, when the balance of the power ratio of the power sources 304a and 304b exceeds the range of the second predetermined value, the maintenance information screen is displayed on the display screen of the input/output device 261, and the maintenance data is transmitted to the host device 290. Accordingly, even when a failure or the like is highly likely to occur in any one of the power sources 304a and 304b, it is possible to promptly and appropriately cope with the maintenance for repairing the failure or the like.

(5) Effects of the Present Embodiments

According to the present embodiments, one or more effects mentioned below may be obtained.

(a) In the present embodiments, the second power supply part 304 includes two or more power sources 304a and 304b. After the second control part 305 adjusts the power ratio of the power sources 304a and 304b to a predetermined value, power is supplied to the first control part 303. Therefore, the lifespan of the second power supply part 304 that supplies power to the first control part 303 can be extended, and the resistance to a failure or the like in the second power supply part 304 can be made excellent. That is, by setting the power ratio of the two or more power sources 304a and 304b to a predetermined value, the lifespan of the power sources necessary for operation control can be extended as compared with a case where only one power source is used.

(b) In the present embodiments, when the balance of the power ratio of the two or more power sources 304a and 304b of the second power supply part 304 exceeds the range of the first predetermined value, the alarm screen for selecting whether or not to start the next substrate-processing process is displayed and outputted, whereby alarm notification is given to the apparatus operator. Therefore, it is possible to allow the apparatus operator to select whether or not to start the next substrate processing. Even if a failure or the like occurs in any one of the power sources 304a and 304b, it is possible to suppress occurrence of damage to the substrate or occurrence of an abnormality of a processing atmosphere under the influence of the failure or the like. That is, it is possible to prevent the failure or the like of each of the power sources 304a and 304b from affecting the film-forming process or the like, which makes it possible to optimize the safety interlock process.

(c) In the present embodiments, when the balance of the power ratio of the two or more power sources 304a and 304b of the second power supply part 304 exceeds the range of the second predetermined value, power source switching is performed so that at least one selected from the group of the power sources 304a and 304b is turned off and at least the other of the power sources 304a and 304b is turned on. In that state, power is supplied to the first control part 303. Therefore, even when the balance of the power ratio of the power sources 304a and 304b is significantly lost and a failure or the like is highly likely to occur in any one of the power sources 304a and 304b, it is possible to appropriately supply power to the first control part 303 without interrupting the power supply to the first control part 303.

Moreover, even when the balance of the power ratio of the two or more power sources 304a and 304b exceeds the range of the second predetermined value, the alarm notification is performed to thereby prevent the failure or the like of each of the power sources 304a and 304b from affecting the film-forming process or the like.

(d) In the present embodiments, when the balance of the power ratio of the two or more power sources 304a and 304b of the second power supply part 304 exceeds the range of the second predetermined value, the maintenance information screen is displayed and outputted on the input/output device 261 and the maintenance data is transmitted to the host device 290. Accordingly, even when a failure or the like is highly likely to occur in any one of the power sources 304a and 304b, it is possible to promptly and appropriately cope with the maintenance for repairing the failure or the like.

OTHER EMBODIMENTS

Although embodiments of the present disclosure have been concretely described above, the present disclosure is not limited to the above-described embodiments. Various changes may be made without departing from the spirit of the present disclosure.

In the above-described embodiments, the film-forming process such as the CVD process for forming the SiO film on the wafer surface is taken as an example of the process performed in the substrate-processing process. However, the present disclosure is not limited thereto. That is, the present disclosure may be applied to film-forming processes for forming a film other than the thin film exemplified in the above-described embodiments, in addition to the film-forming process exemplified in the above-described embodiments. Furthermore, the specific content of the substrate processing does not matter. The present disclosure may be applied to not only the film-forming process but also other substrate-processing processes such as a heat treatment (annealing process), a plasma process, a diffusion process, an oxidation process, a nitriding process, a lithography process, and the like.

Figure 12:
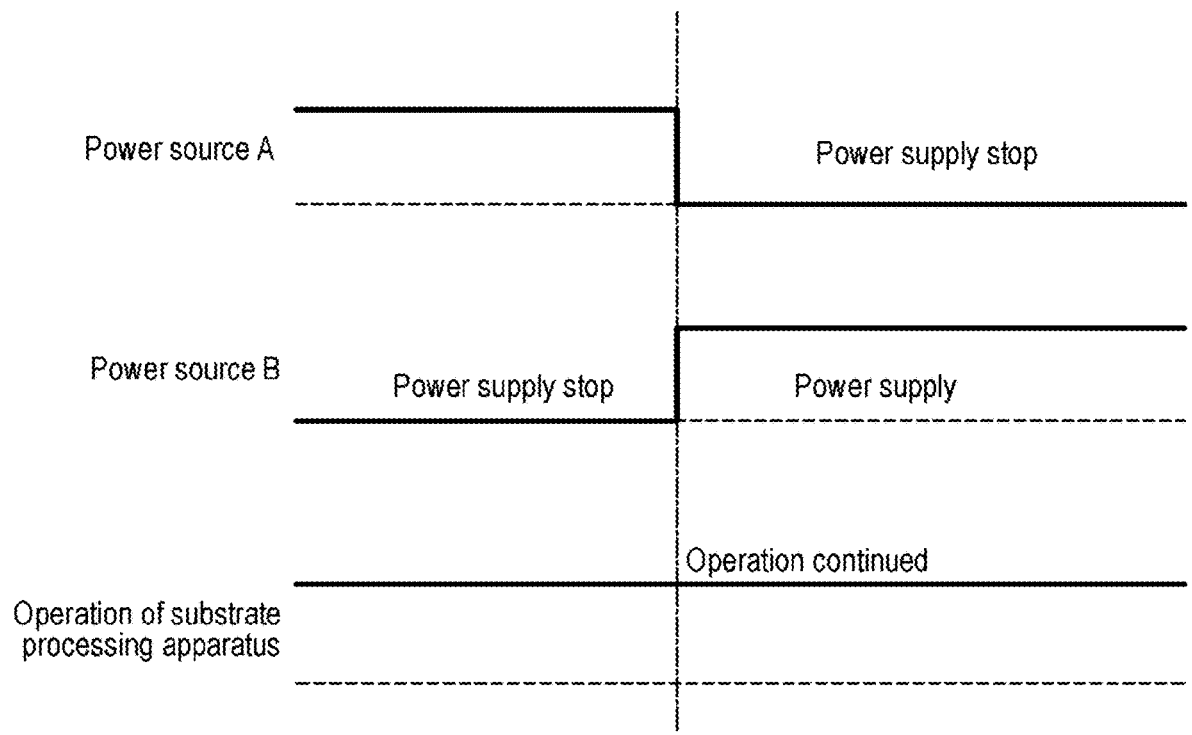
FIG. 12 is an explanatory view showing a modification of the power supply control performed by the substrate processing apparatus according to embodiments of the present disclosure.

Furthermore, in the above-described embodiments, the case where the second power supply part 304 includes the two power sources 304a and 304b has been mainly described as an example. However, the present disclosure is not limited thereto. As mentioned above, the second power supply part 304 may include two or more power sources. This means that it is possible to cope with the following processing operations in addition to the processing operations described in the above-described embodiments. For example, as shown in FIG. 12, when operating the substrate processing apparatus 1 or 100, at least one power source A among the two or more power sources is kept in a power supply state, and at least the other power source B is kept in a power supply stop state. At this time, an additional power source may be kept in a power supply state. In that case, the power ratio is adjusted between the power source A and the additional power source. In this state, for example, when it is detected that the power source A has stopped functioning due to a failure or the like, the second control part 305 performs power source switching so that the power source A is kept in a power supply stop state while the power source B is kept in a power supply state. With this configuration, even if the power source A has a failure or the like, power is supplied by the power source B, so that the substrate processing apparatus 1 or 100 can be continuously operated. That is, it is possible to realize a long-term continuous operation of the substrate processing apparatus 1 or 100. As a result, it is possible to comprehensively improve the reliability of the substrate processing apparatus 1 or 100.

<Aspects of Present Disclosure>

Hereinafter, some aspects of the present disclosure will be additionally described as supplementary notes.

(Supplementary Note 1)

According to one aspect of the present disclosure, there is provided a substrate processing apparatus, including: a process chamber configured to process a substrate; a processing gas supply part configured to supply a processing gas to the substrate; a heater configured to heat the substrate; a transfer robot configured to transfer the substrate; a first power supply connected to at least one part selected from the group of the processing gas supply part, the heater, and the transfer robot; a first controller installed between the at least one part and the first power supply; a second power supply including two or more power sources configured to drive the first controller; and a second controller installed between the first controller and the second power supply and configured to allow power to be supplied to the first controller while setting a power ratio of each of the two or more power sources of the second power supply to a predetermined value.

(Supplementary Note 2)

Preferably, there is provided the apparatus according to Supplementary Note 1, further including: a third controller connected to each of the processing gas supply part, the heater, the transfer robot, the first controller, and the second controller; and a display configured to perform display output under a control of the third controller, wherein when it is detected by the second controller that the power ratio of the two or more power sources deviates from a first predetermined range, the second controller transmits first detection data to the third controller, and wherein when the first detection data is received by the third controller, the third controller causes the display to display an alarm screen relating to a substrate processing currently being performed.

(Supplementary Note 3)

Preferably, there is provided the apparatus according to Supplementary Note 2, wherein when it is detected by the second controller that the power ratio of the two or more power sources deviates from a second predetermined range, the second controller transmits second detection data to the third controller and allows power to be supplied to the first controller by turning off at least first one of the two or more power sources and turning on at least second one of the two or more power sources, and wherein when the second detection data is received by the third controller, the third controller causes the display to display an alarm screen relating to a substrate processing currently being performed.

(Supplementary Note 4)

Preferably, there is provided the apparatus according to Supplementary Note 2 or 3, wherein the alarm screen is a screen for selecting whether a start of a next substrate processing is required or not.

(Supplementary Note 5)

Preferably, there is provided the apparatus according to any one of Supplementary Notes 2 to 4, wherein when it is detected by the second controller that the power ratio of the two or more power sources deviates from a second predetermined range, the second controller transmits second detection data to the third controller and allows power to be supplied to the first controller by turning off at least first one of the two or more power sources and turning on at least second one of the two or more power sources, and wherein when the second detection data is received by the third controller, the third controller causes the display to display a maintenance information screen relating to a power source.

(Supplementary Note 6)

Preferably, there is provided the apparatus according to Supplementary Note 5, wherein the maintenance information screen is a screen for notifying that maintenance of one of the two or more power sources is required.

(Supplementary Note 7)

Preferably, there is provided the apparatus according to Supplementary Note 4 or 5, wherein the third controller causes the display to display the maintenance information screen and transmits maintenance data to a host device connected to the third controller.

(Supplementary Note 8)

According to another aspect of the present disclosure, there is provided a method of manufacturing a semiconductor device, including: processing a substrate; when processing the substrate, supplying power to at least one part, which is selected from the group of a processing gas supply part configured to supply a processing gas to the substrate, a heater configured to heat the substrate, and a transfer robot configured to transfer the substrate, from a first power supply connected to the at least one part, and controlling power supply from the first power supply by a first controller installed between the at least one part and the first power supply; and performing power supply to the first controller from a second power supply including two or more power sources configured to drive the first controller, and when performing the power supply, allowing a second controller installed between the first controller and the second power supply to set a power ratio of each of the two or more power sources of the second power supply to a predetermined value.

(Supplementary Note 9)

According to another aspect of the present disclosure, there is provided a program that causes, by a computer, a substrate processing apparatus to perform a process including: processing a substrate; when processing the substrate, supplying power to at least one part, which is selected from the group of a processing gas supply part configured to supply a processing gas to the substrate, a heater configured to heat the substrate, and a transfer robot configured to transfer the substrate, from a first power supply connected to the at least one part, and controlling power supply from the first power supply by a first controller installed between the at least one part and the first power supply; and performing power supply to the first controller from a second power supply including two or more power sources configured to drive the first controller, and when performing the power supply, allowing a second controller installed between the first controller and the second power supply to set a power ratio of each of the two or more power sources of the second power supply to a predetermined value.

(Supplementary Note 10)

According to another aspect of the present disclosure, there is provided a non-transitory computer-readable recording medium storing a program that causes, by a computer, a substrate processing apparatus to perform a process including: processing a substrate; when processing the substrate, supplying power to at least one part, which is selected from the group of a processing gas supply part configured to supply a processing gas to the substrate, a heater configured to heat the substrate, and a transfer robot configured to transfer the substrate, from a first power supply connected to the at least one part, and controlling power supply from the first power supply by a first controller installed between the at least one part and the first power supply; and performing power supply to the first controller from a second power supply including two or more power sources configured to drive the first controller, and when performing the power supply, allowing a second controller installed between the first controller and the second power supply to set a power ratio of each of the two or more power sources of the second power supply to a predetermined value.

According to the present disclosure in some embodiments, by setting the power ratio of two or more power sources to a predetermined value, it is possible to prolong the lifespan of the power sources as compared with a case where only one power source is used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   processing a substrate;
   when processing the substrate, supplying power to at least one part, which is selected from the group of a processing gas supply part configured to supply a processing gas to the substrate, a heater configured to heat the substrate, and a transfer robot configured to transfer the substrate, from a first power supply connected to the at least one part, and controlling power supply from the first power supply by a first controller installed between the at least one part and the first power supply;
   performing power supply to the first controller from a second power supply including two or more power sources configured to drive the first controller, and when performing the power supply, allowing a second controller installed between the first controller and the second power supply to set a power ratio of each of the two or more power sources of the second power supply to a predetermined value; and
   when it is detected by the second controller that the power ratio of the two or more power sources deviates from a first predetermined range, further determining whether the power ratio deviates from a second predetermined range different from the first predetermined range detected by the second controller, and allowing power to be supplied to the first controller by turning off at least first one of the two or more power sources and turning on at least second one of the two or more power sources.

2. The method according to claim 1, further comprising:
   when it is detected by the second controller that the power ratio of the two or more power sources deviates from the first predetermined range but does not deviate from the second predetermined range, transmitting, by the second controller, first detection data to a third controller connected to each of the processing gas supply part, the heater, the transfer robot, the first controller, and the second controller; and
   when the first detection data is received by the third controller, causing, by the third controller, a display to display an alarm screen relating to a substrate processing currently being performed.

3. The method according to claim 2, further comprising:
   when it is detected by the second controller that the power ratio of the two or more power sources deviates from the second predetermined range, transmitting, by the second controller, second detection data to the third controller; and
   when the second detection data is received by the third controller, causing, by the third controller, the display to display an alarm screen relating to a substrate processing currently being performed.

4. The method according to claim 3, wherein in the act of causing the display to display the alarm screen, the display is caused to display a screen for selecting whether a start of a next substrate processing is required or not.

5. The method according to claim 2, further comprising:
   when it is detected by the second controller that the power ratio of the two or more power sources deviates from the second predetermined range, transmitting, by the second controller, second detection data to the third controller; and
   when the second detection data is received by the third controller, causing, by the third controller, the display to display a maintenance information screen relating to a power source.

6. The method according to claim 5, wherein in the act of causing the display to display the maintenance information screen, it is notified that maintenance of one of the two or more power sources is required.

7. The method according to claim 5, further comprising:
   causing, by the third controller, the display to display the maintenance information screen and transmitting, by the third controller, maintenance data to a host device connected to the third controller.

* * * * *